United States Patent
Yamauchi et al.

(10) Patent No.: US 9,078,343 B2
(45) Date of Patent: Jul. 7, 2015

(54) METHOD FOR MANUFACTURING PRINTED WIRING BOARD

(75) Inventors: Tsutomo Yamauchi, Ogaki (JP); Satoru Kawai, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 671 days.

(21) Appl. No.: 13/325,105

(22) Filed: Dec. 14, 2011

(65) Prior Publication Data

US 2012/0213944 A1 Aug. 23, 2012

Related U.S. Application Data

(60) Provisional application No. 61/445,339, filed on Feb. 22, 2011.

(51) Int. Cl.
*H05K 3/00* (2006.01)
*H05K 3/46* (2006.01)

(52) U.S. Cl.
CPC ............ *H05K 3/0032* (2013.01); *H05K 3/4602* (2013.01); *H05K 2201/09827* (2013.01); *H05K 2201/09854* (2013.01); *H05K 2203/1476* (2013.01); *H05K 2203/1572* (2013.01)

(58) Field of Classification Search
None
See application file for complete search history.

(56) References Cited

U.S. PATENT DOCUMENTS

| | | | |
|---|---|---|---|
| 6,581,280 B2 * | 6/2003 | Gruber et al. | 29/832 |
| 7,057,133 B2 | 6/2006 | Lei et al. | |
| 7,284,323 B2 | 10/2007 | Cheng | |
| 2004/0173942 A1 * | 9/2004 | Kobayashi et al. | 264/400 |
| 2006/0021794 A1 | 2/2006 | Cheng | |
| 2007/0262464 A1 * | 11/2007 | Watkins et al. | 257/774 |
| 2008/0257591 A1 * | 10/2008 | Ikeda | 174/255 |
| 2009/0151996 A1 * | 6/2009 | Mishima et al. | 174/262 |
| 2010/0089632 A1 | 4/2010 | Ikeda | |
| 2010/0155112 A1 | 6/2010 | Ikeda | |
| 2010/0307807 A1 | 12/2010 | Noda et al. | |
| 2010/0307809 A1 | 12/2010 | Noda et al. | |
| 2012/0012464 A1 | 1/2012 | Ikeda | |
| 2012/0175155 A1 | 7/2012 | Ikeda | |

FOREIGN PATENT DOCUMENTS

| | | |
|---|---|---|
| CN | 101352109 A | 1/2009 |
| JP | 2006-041463 | 2/2006 |
| JP | 2007-227512 | 9/2007 |
| JP | 2007-227512 A | 9/2007 |
| JP | 2010-287879 | 12/2010 |
| TW | I235019 | 6/2005 |
| TW | I313206 | 8/2009 |
| WO | 2007/097440 A1 | 8/2007 |

* cited by examiner

*Primary Examiner* — Dah-Wei D Yuan
*Assistant Examiner* — Jose Hernandez-Diaz
(74) *Attorney, Agent, or Firm* — Oblon, McClelland, Maier & Neustadt, L.L.P.

(57) ABSTRACT

A method for manufacturing a printed wiring board including forming a penetrating hole in a core substrate, forming a first conductor on a first surface of the substrate, forming a second conductor on a second surface of the substrate, and filling a conductive material in the hole such that a through-hole conductor is formed in the hole and the first and second conductors are connected via the through-hole conductor. The forming of the hole includes forming a first opening in the first surface, forming a second opening from the bottom of the first opening toward the second surface such that the second opening has a smaller diameter than the first opening, forming a third opening in the second surface, and forming a fourth opening from the bottom of the third opening toward the first surface such that the fourth opening has a smaller diameter than the third opening.

20 Claims, 12 Drawing Sheets

FIG. 4
(A)
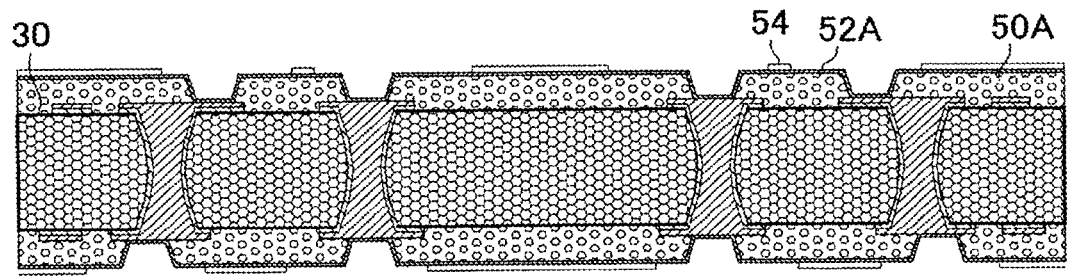
(B)
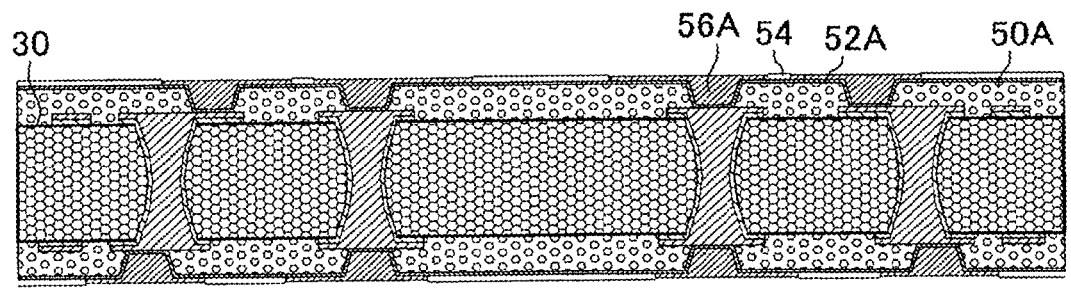
(C)
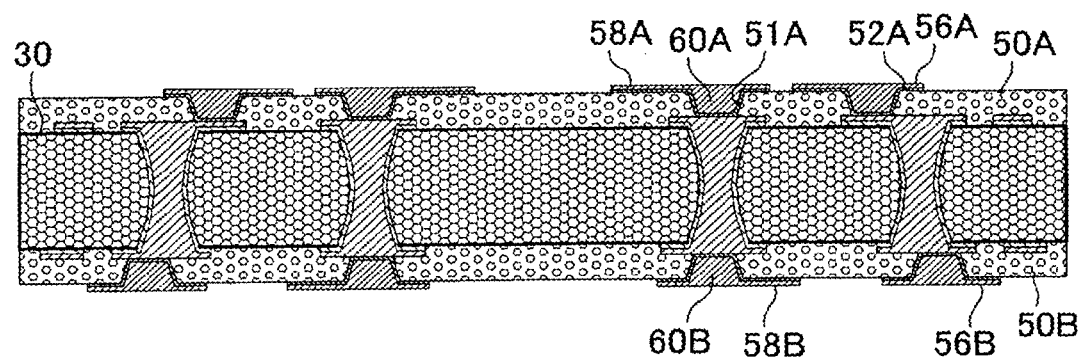

FIG. 5
(A)
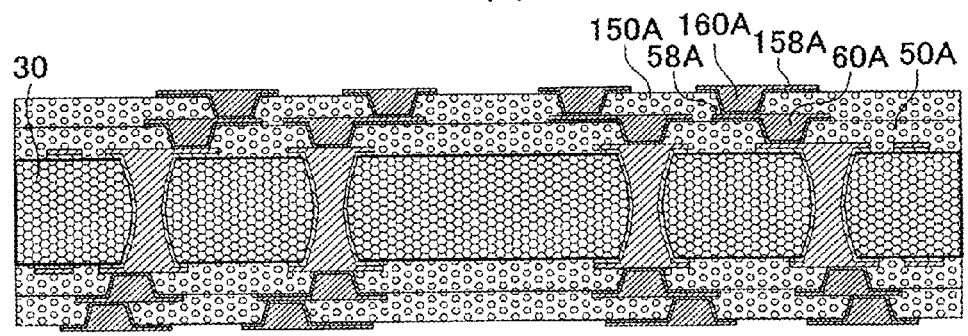
(B)
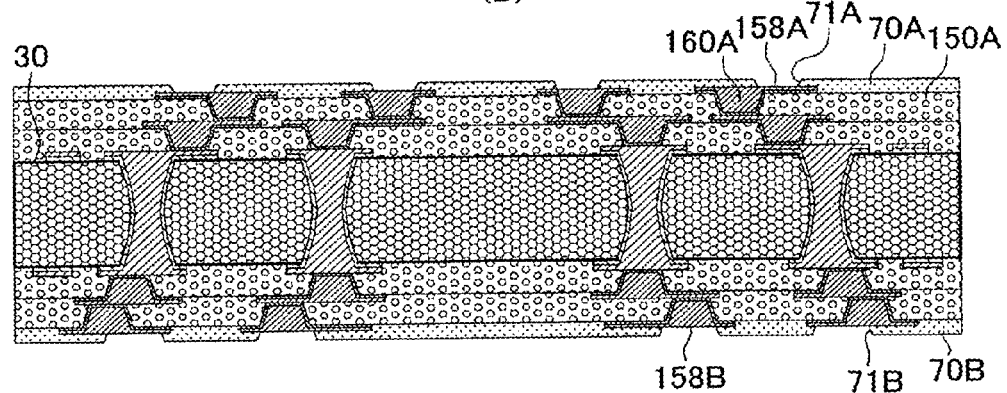
(C)
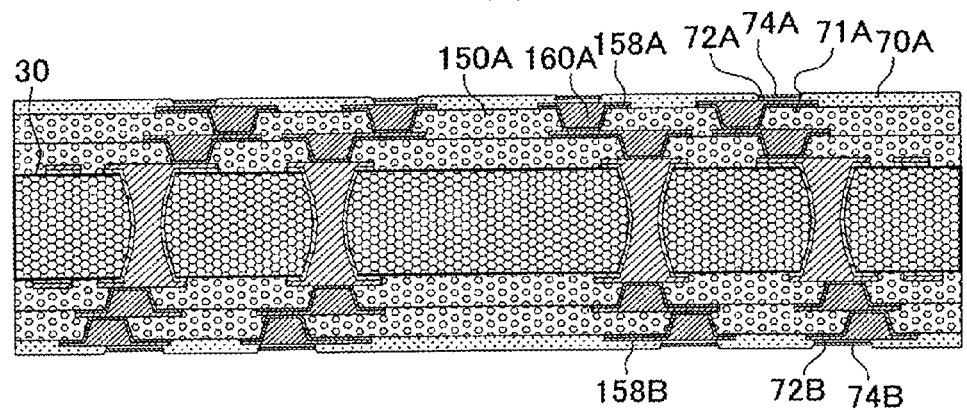

FIG. 7
(A)
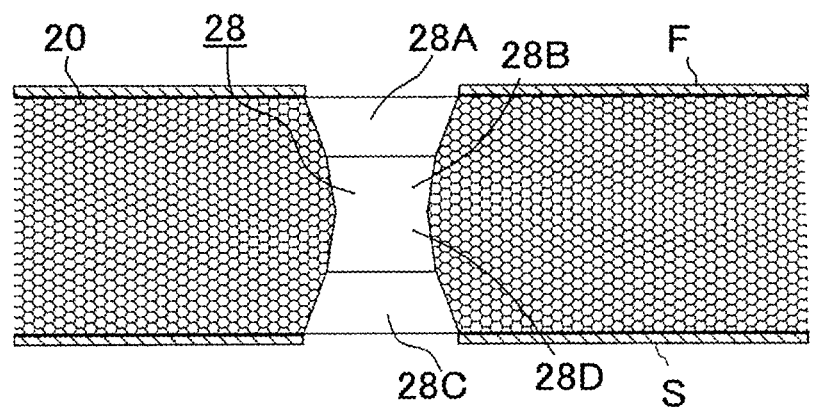
(B)
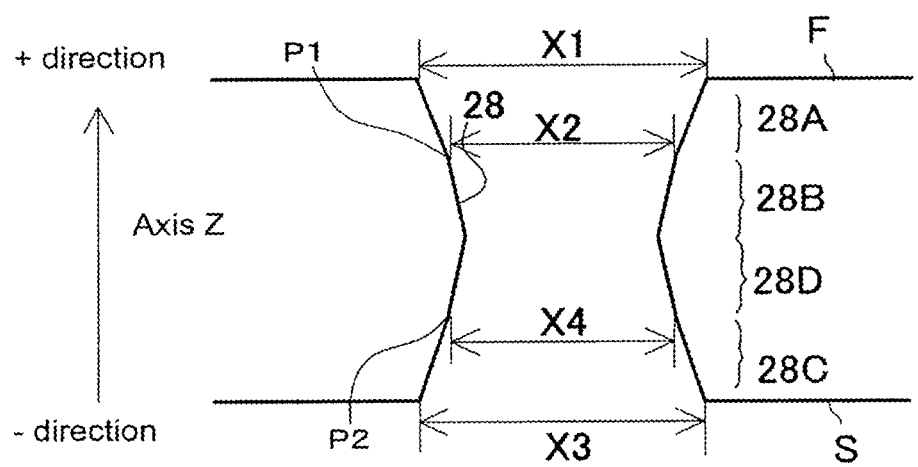

FIG. 10
(A)
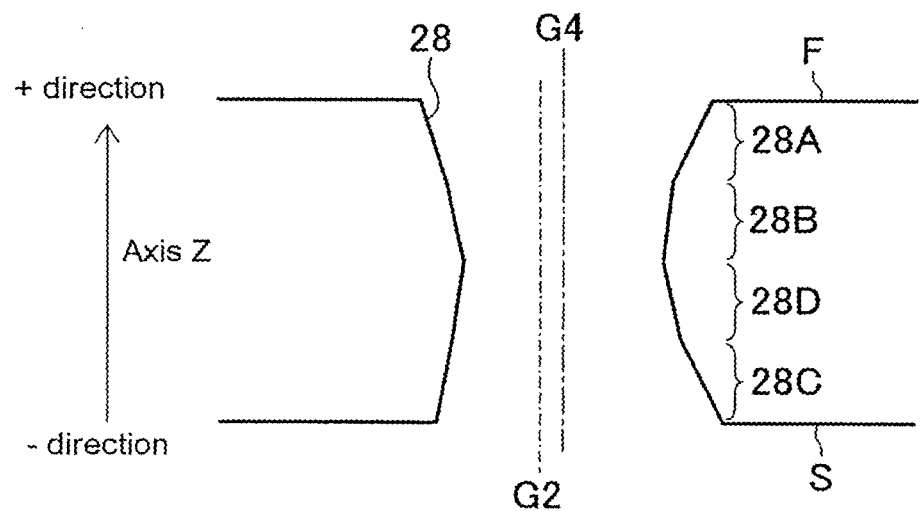
(B)
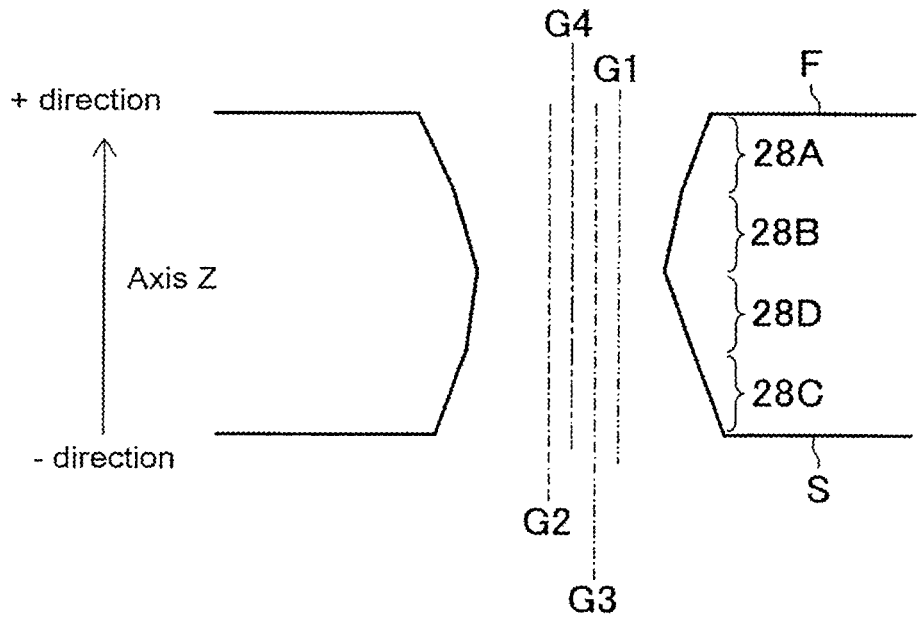

METHOD FOR MANUFACTURING PRINTED WIRING BOARD

CROSS-REFERENCE TO RELATED APPLICATIONS

The present application is based on and claims the benefit of priority to U.S. Application No. 61/445,339, filed Feb. 22, 2011, the entire contents of which are incorporated herein by reference.

BACKGROUND OF THE INVENTION

1. Field of the Invention

The present invention relates to a method for manufacturing a printed wiring board which includes a core substrate having a penetrating hole, a first conductor and a second conductor formed on the core substrate, and a through-hole conductor formed in the penetrating hole and connecting the first conductor and the second conductor.

2. Discussion of the Background

In Japanese Laid-Open Patent Publication 2006-41463, a penetrating hole is formed by forming a first opening portion from an upper-surface side (a first-surface side) of a core substrate using a laser, and by forming a second opening portion from a lower-surface side (a second-surface side) using a laser as well. The first opening portion tapers toward the second surface, and the second opening portion tapers toward the first surface. Then, by filling the inside of the penetrating hole with plating, a through-hole conductor with a small diameter is formed and the upper and lower surfaces of the core substrate are connected. The contents of this publication are incorporated herein by reference in its entirety.

SUMMARY OF THE INVENTION

According to one aspect of the present invention, a method for manufacturing a printed wiring board includes preparing a core substrate, forming a penetrating hole in the core substrate, forming a first conductor on a first surface of the core substrate, forming a second conductor on a second surface of the core substrate on the opposite side of the first surface of the core substrate, and filling a conductive material in the penetrating hole such that a through-hole conductor is formed in the penetrating hole and the first conductor and the second conductor are connected via the through-hole conductor. The forming of the penetrating hole includes forming a first opening portion in the first surface of the core substrate, forming a second opening portion from the bottom of the first opening portion toward the second surface such that the second opening portion has the diameter which is smaller than the diameter of the first opening portion, forming a third opening portion in the second surface of the core substrate, and forming a fourth opening portion from the bottom of the third opening portion toward the first surface such that the fourth opening portion has the diameter which is smaller than the diameter of the third opening portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(A)-(C) are views showing steps of a method for manufacturing a multilayer printed wiring board according to the first example;

FIGS. 5(A)-(C) are views showing steps of a method for manufacturing a multilayer printed wiring board according to the first example;

FIG. 7(A) is a cross-sectional view of a core substrate having a penetrating hole, and FIG. 7(B) is a cross-sectional view of the penetrating hole;

FIGS. 10(A)-(B) are views to illustrate penetrating holes relating to the first example;

DETAILED DESCRIPTION OF THE EMBODIMENTS

Figure 1:
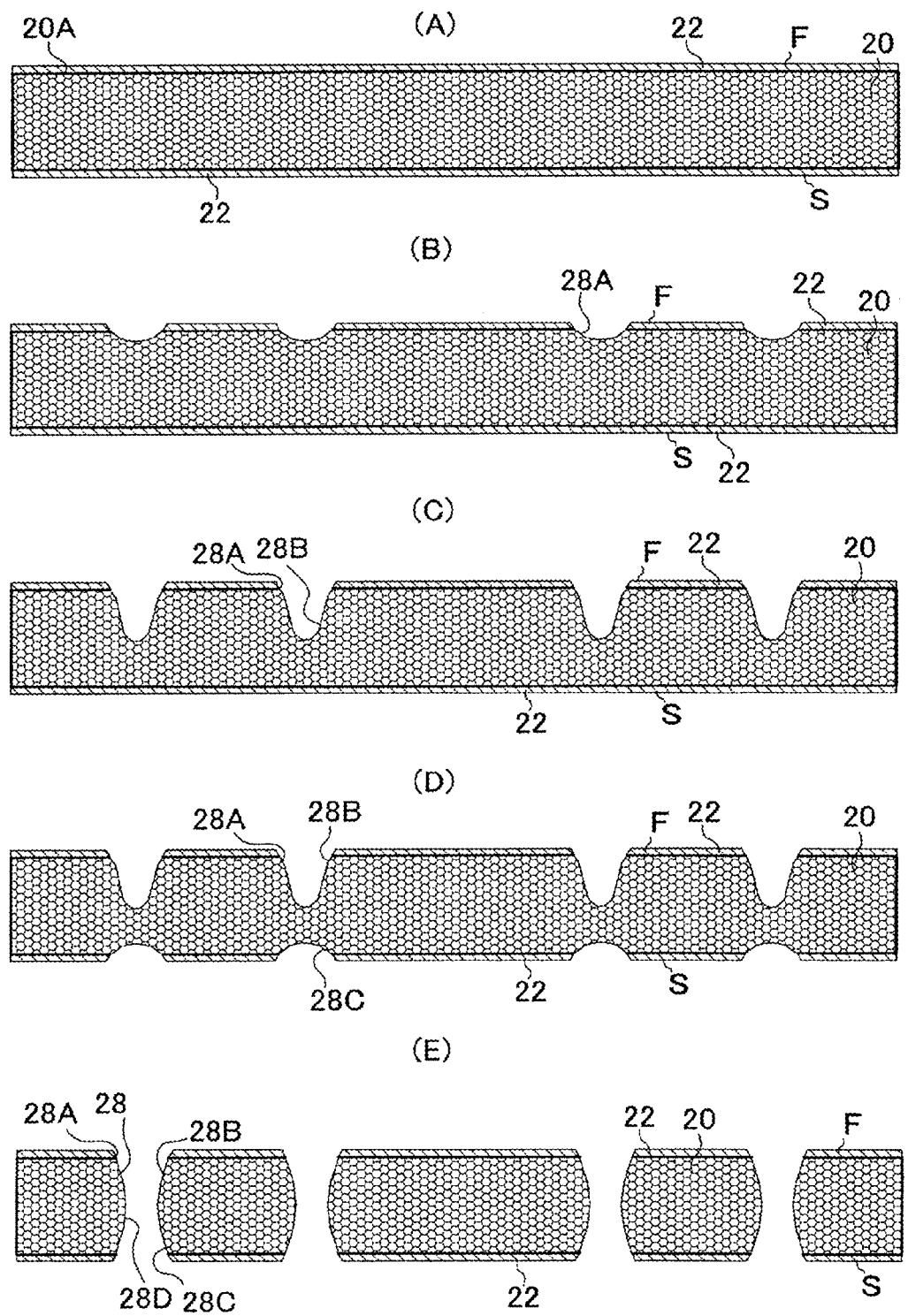
FIGS. 1(A)-(E) are views showing steps of a method for manufacturing a multilayer printed wiring board according to a first example of the present invention.
Figure 2:
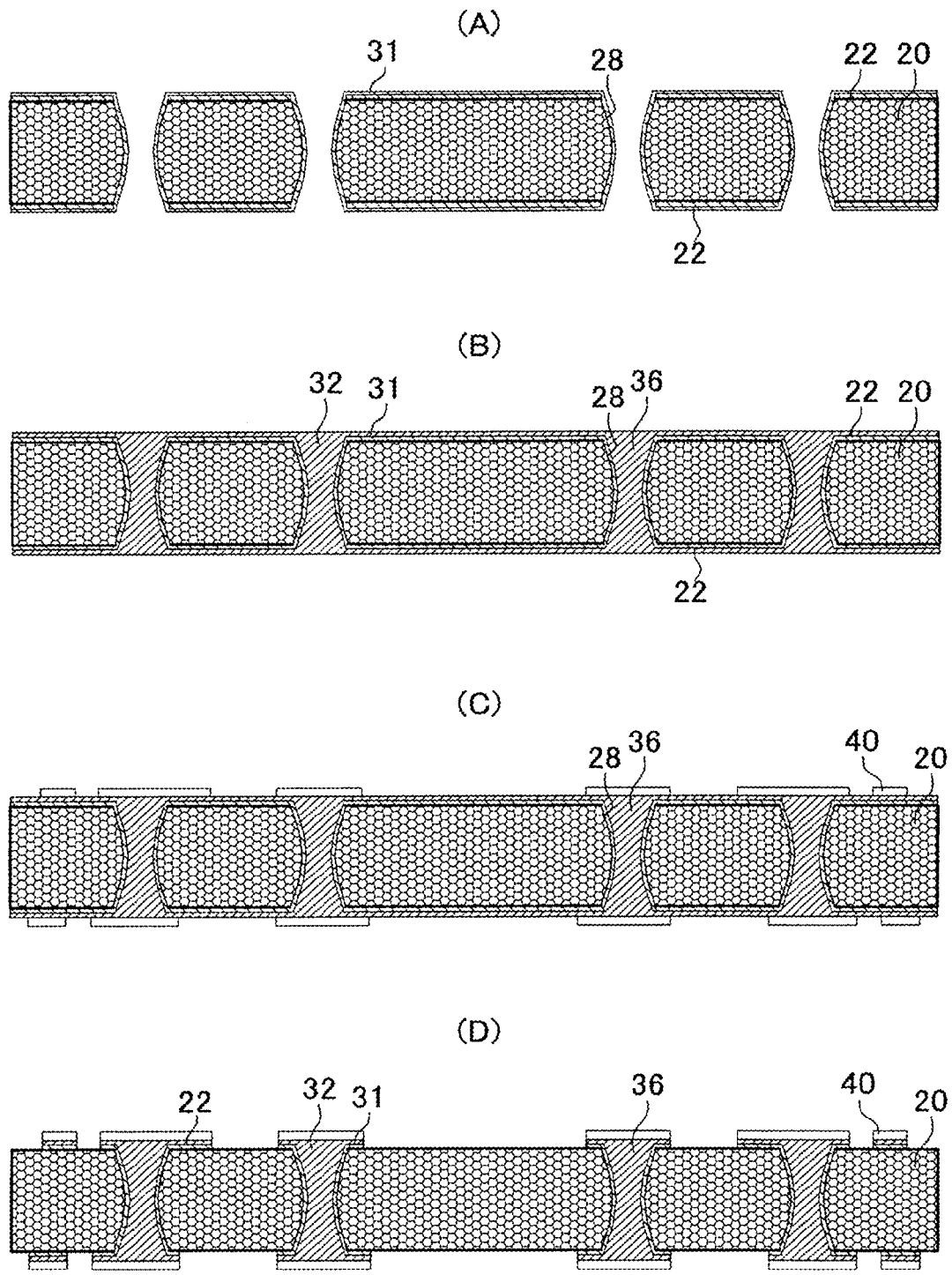
FIGS. 2(A)-(D) are views showing steps of a method for manufacturing a multilayer printed wiring board according to the first example.
Figure 3:
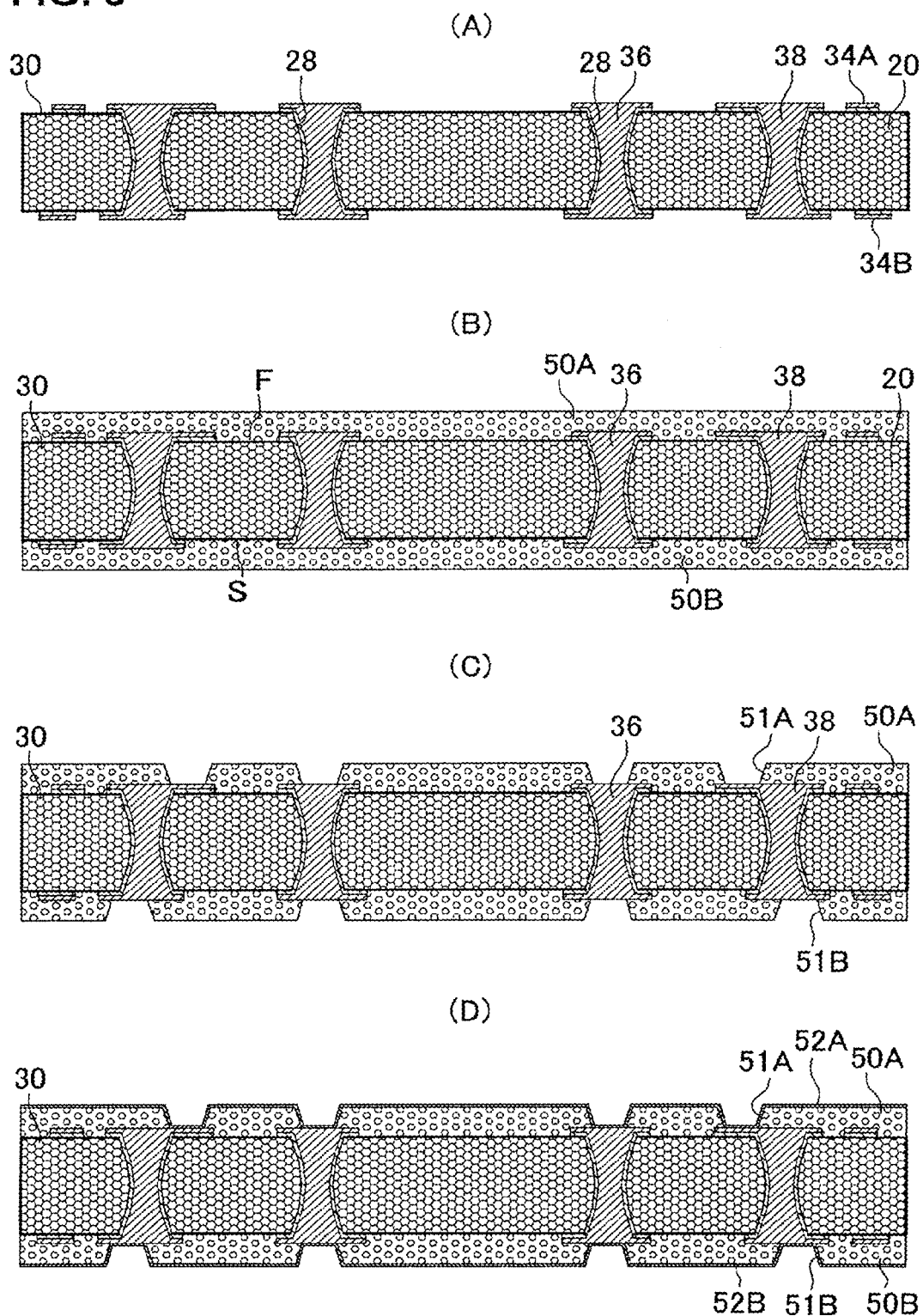
FIGS. 3(A)-(D) are views showing steps of a method for manufacturing a multilayer printed wiring board according to the first example.

The embodiments will now be described with reference to the accompanying drawings, wherein like reference numerals designate corresponding or identical elements throughout the various drawings.

Figure 6:
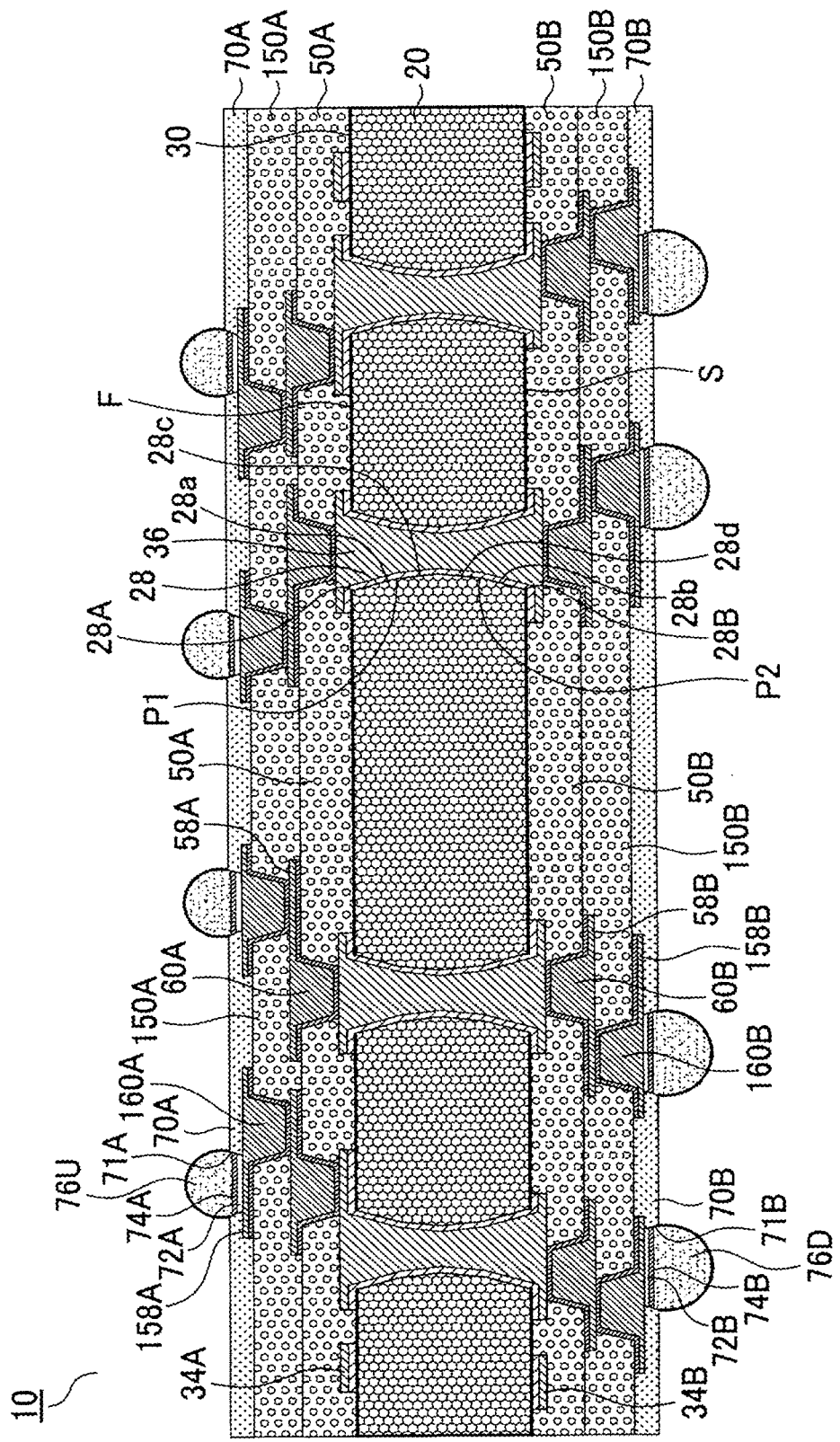
FIG. 6 is a cross-sectional view of a multilayer printed wiring board before an IC chip is mounted.

A multilayer printed wiring board manufactured by the manufacturing method according to an embodiment of the present invention is described by referring to the cross-sectional view shown in FIG. 6. FIG. 6 shows multilayer printed wiring board 10 before an IC chip is mounted.

In multilayer printed wiring board 10 of the present embodiment, first conductor (34A) is formed on first surface (F) of core substrate 20, and second conductor (34B) is formed on second surface (S). First conductor (34A) and second conductor (34B) are electrically connected by through-hole conductor 36.

Interlayer resin insulation layer (50A) is formed on first surface (F) of core substrate 20 and on first conductor (34A). Third conductor (58A) is formed on interlayer resin insulation layer (50A). Third conductor (58A) and first conductor (34A) are connected by via conductor (60A) which penetrates through interlayer resin insulation layer (50A). Interlayer resin insulation layer (150A) is formed on interlayer resin insulation layer (50A) and on third conductor (58A). Fourth conductor (158A) is formed on interlayer resin insulation layer (150A). Fourth conductor (158A) and third conductor (58A) are connected by via conductor (160A) which penetrates through interlayer resin insulation layer (150A).

Meanwhile, interlayer resin insulation layer (50B) is formed on second surface (S) of core substrate 20 and on second conductor (34B). Third conductor (58B) is formed on interlayer resin insulation layer (50B). Third conductor (58B) and second conductor (34B) are connected by via conductor (60B) which penetrates through interlayer resin insulation layer (50B). Interlayer resin insulation layer (150B) is formed on interlayer resin insulation layer (50B) and on third conductor (58B). Fourth conductor (158B) is formed on interlayer resin insulation layer (150B). Fourth conductor (158B) and third conductor (58B) are connected by via conductor (160B) which penetrates through interlayer resin insulation layer (150B).

Solder-resist layer (70A) is formed on interlayer resin insulation layer (150A), and solder-resist layer (70B) is formed on interlayer resin insulation layer (150B). Solder-resist layers (70A, 70B) have openings (71A, 71B) which expose at least portions of fourth conductors (158A, 158B) respectively. Solder bumps (76U, 76D) are formed respectively in openings (71A, 71B).

Next, through-hole conductor 36 in FIG. 6 is described.

Core substrate 20 is an insulative substrate having first surface (F) and second surface (S) opposite first surface (F). Core substrate 20 has penetrating hole 28. Through-hole conductor 36 is made of metal that fills penetrating hole 28 by plating.

A magnified view of penetrating hole 28 is shown in FIG. 7(A). Penetrating hole 28 includes first opening portion (28A) formed on the first-surface (F) side of core substrate 20, second opening portion (28B) formed from the bottom of first opening portion (28A) toward second surface (S), third opening portion (28C) formed on the second-surface (S) side of core substrate 20, and fourth opening portion (28D) formed from the bottom of third opening portion (28D) toward first surface (F).

First opening portion (28A) and second opening portion (28B) are formed by irradiating a laser from the first-surface (F) side of core substrate 20. Third opening portion (28C) and fourth opening portion (28D) are formed by irradiating a laser from the second-surface (S) side of core substrate 20.

Figure 8:
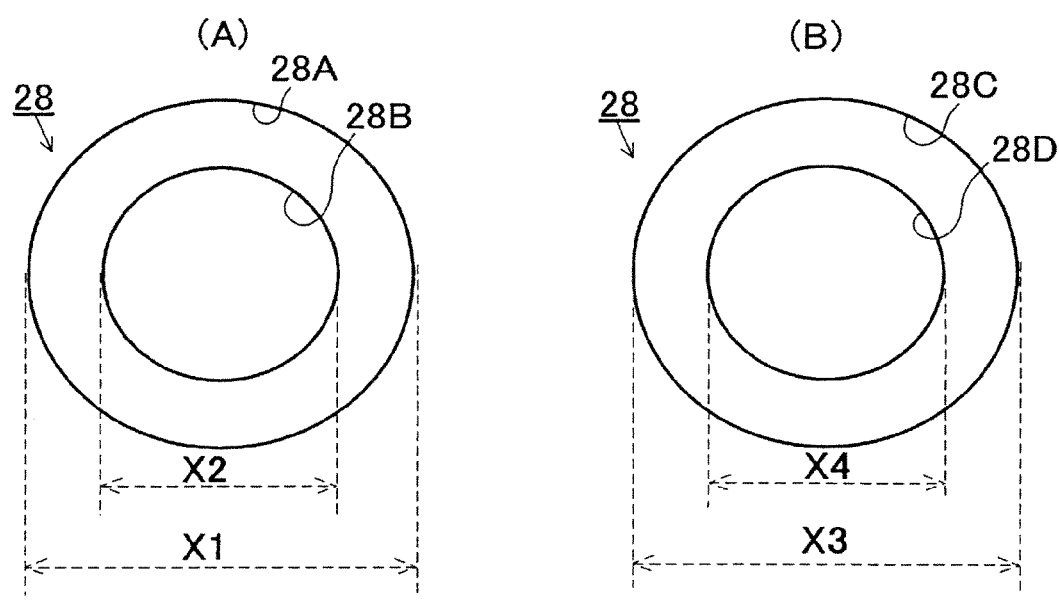
FIGS. 8(A)-(B) are plan views of opening portions.

As shown in FIG. 7(B) and FIG. 8, diameter (X2) of second opening portion (28B) is smaller than diameter (X1) of first opening portion (28A), and diameter (X4) of fourth opening portion (28D) is smaller than diameter (X3) of third opening portion (28B). In first opening portion (28A) and second opening portion (28B), the diameters become narrower from first surface (F) of core substrate 20 toward second surface (S). In third opening portion (28C) and fourth opening portion (28D), the diameters become narrower from second surface (S) of core substrate 20 toward first surface (F).

Here, diameters (X1)~(X4) of their respective opening portions (28A)~(28D) each mean the inner diameter of an opening portion, and respectively indicate the maximum value among the distances between inner walls facing each other at any point in the opening portion.

When the ratio is set as ($\Delta$W1) at which the inner diameter of first opening portion (28A) becomes narrower in a direction from first surface (F) of core substrate 20 toward second surface (S), and when the ratio is set as ($\Delta$W2) at which the inner diameter of second opening portion (28B) becomes narrower in a direction from first surface (F) of core substrate 20 toward second surface (S), $\Delta W1 > \Delta W2$ is satisfied. Also, when the ratio is set as ($\Delta$W3) at which the inner diameter of third opening portion (28C) becomes narrower in a direction from second surface (S) of core substrate 20 toward first surface (F), and when the ratio is set as ($\Delta$W4) at which the inner diameter of fourth opening portion (28D) becomes narrower in a direction from second surface (S) of core substrate 20 toward first surface (F), $\Delta W3 > \Delta W4$ is satisfied. Accordingly, penetrating hole 28 has bent portion (P1) by being bent at the connection portion of first opening portion (28A) and second opening portion (28B). In addition, penetrating hole 28 has bent portion (P2) by being bent at the connection portion of third opening portion (28C) and fourth opening portion (28D).

According to the embodiment of the present invention, opening portions (28B, 28D), which have relatively small ratios at which their inner diameters become narrower, are connected to each other from both sides. Thus, the inner diameter tends to be great at the connection portions. Namely, compared to a case in which first opening portion (28A) and third opening portion (28C) are directly connected to form a penetrating hole, minimum diameter (Wmin) of the penetrating hole (the diameter at the connection portion of the third opening portion and the fourth opening portion) tends to be great in the present embodiment. Accordingly, cracking seldom occurs at a connection portion in the through-hole conductor. Moreover, through-hole conductors are formed highly densely while the reliability of through-hole conductors with smaller diameters is suppressed from decreasing.

In addition, in the present embodiment, stress generated in through-hole conductor 36 is dispersed in at least two locations: the connection portion (bent portion P1) of first opening portion (28A) and second opening portion (28B) and the connection portion (bent portion P2) of third opening portion (28C) and fourth opening portion (28D). Accordingly, cracking seldom occurs. Moreover, since stress generated in a through-hole conductor is dispersed at bent portions (P1, P2), the stress exerted on end-portion sides of the through-hole conductor is also mitigated, and through-hole conductor 36 and via conductor 60 directly on through-hole conductor 36 are seldom removed from each other, leading to their enhanced connection reliability.

Figure 9:
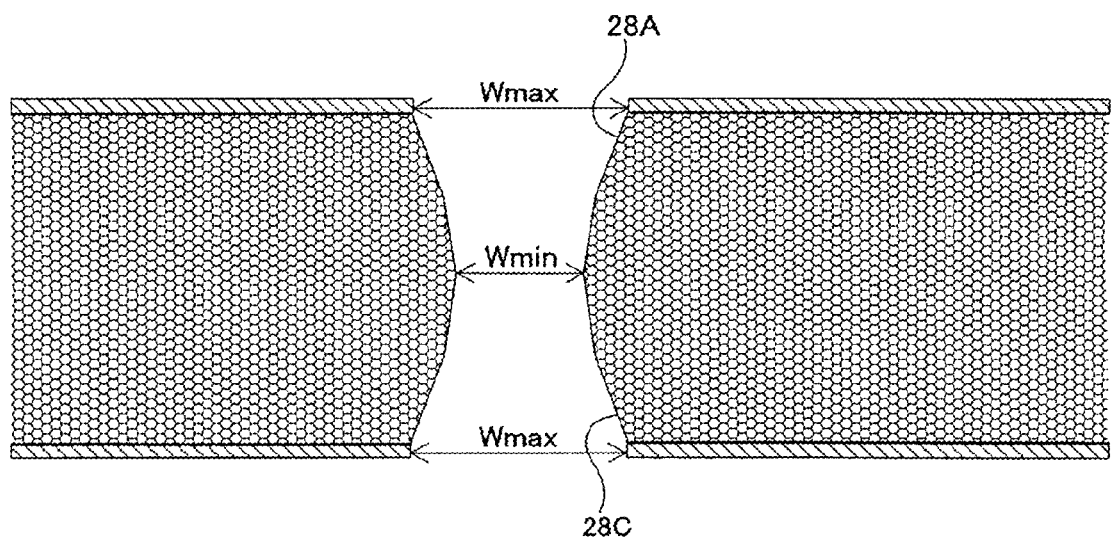
FIG. 9 is a cross-sectional view of a core substrate having a penetrating hole.

In an embodiment of the present invention, when the maximum diameter of penetrating hole 28 is referred to as (Wmax) as shown in FIG. 9, $0.6 \leq Wmin/Wmax \leq 0.8$ is satisfied. In such a situation, positional accuracy for forming a penetrating hole by connecting opening portions from both sides of core substrate 20 is enhanced. Moreover, the preferred reliability of through-hole conductor 36 is ensured even when core substrate 20 warps due to thermal contraction. Here, maximum diameter (Wmax) of penetrating hole 28 means diameter (X1) of first opening portion (28A) or diameter (X3) of third opening portion (28C).

Also, as shown in FIG. 10(A), straight line (G2) passing through the gravity center of second opening portion (28B) and perpendicular to first surface (F) of core substrate 20 may be offset from straight line (G4) passing through the gravity center of fourth opening portion (28D) and perpendicular to first surface (F) of core substrate 20. In such a case, the area where second opening portion (28B) is connected to fourth opening portion (28D) increases. As a result, connection reliability in through-hole conductor 36 is enhanced. Also, as shown in FIG. 10(B), when a straight line passing through the gravity center of first opening portion (28A) and perpendicular to first surface (F) of core substrate 20 is referred to as (G1), and when a straight line passing through the gravity center of third opening portion (28C) and perpendicular to first surface (F) of core substrate 20 is referred to as (G3), (G1)~(G4) may all be offset from each other. At that time, the same effect as above is achieved.

Next, a method for manufacturing multilayer printed wiring board 10 is described with reference to FIGS. 1~5.

(1) Core substrate 20 made of reinforcing material and resin is prepared (FIG. 1(A)). Copper foil 22 is laminated on first surface (F) and second surface (S) of core substrate 20. The thickness of core substrate 20 is 0.4~0.7 mm. As for the reinforcing material, for example, glass cloth, aramid fiber, glass fiber and the like are listed. As for the resin, epoxy resin BT (bismaleimide triazine) resin and the like are listed. Moreover, particles made from hydroxide are contained in the resin. As for the hydroxide, metal hydroxides such as aluminum hydroxide, magnesium hydroxide, calcium hydroxide and barium hydroxide are listed. When hydroxide is decomposed by heat, water is generated. Accordingly, it is thought that such a hydroxide takes heat from the material that forms the core substrate. Namely, if a core substrate contains hydroxide, it is thought that performance by laser processing improves. Next, on the surface of copper foil 22, a black-oxide treatment is performed using a solution containing NaOH (10 g/L), NaClO2 (40 g/L) and Na3PO4 (6 g/L) as a black-oxide bath (oxidation bath).

(2) Using a CO2 laser from the first-surface (F) (upper surface) side of core substrate 20, laser irradiation is performed to form first opening portion (28A) on the first-surface (F) side of core substrate 20 (FIG. 1(B)). Using a CO2 laser from the first-surface (F) (upper surface) side of core substrate 20, laser irradiation is performed to form second opening portion (28B) from the bottom of first opening portion (28A) toward second surface (S) (FIG. 1(C)).

Next, using a CO2 laser from the second-surface (S) (lower surface) side of core substrate 20, laser irradiation is performed to form third opening portion (28C) on the second-surface (S) side of the core substrate (FIG. 1(D)). Using a CO2 laser from the second-surface (S) (upper surface) side of core substrate 20, laser irradiation is performed to form fourth opening portion (28D) from the bottom of third opening portion (28C) toward first surface (F). Penetrating hole 28 is formed by connecting third opening portion (28C) and fourth opening portion (28D) in the core substrate (FIG. 1(E)).

At that time, as shown in FIG. 7(B), diameter (X2) of second opening portion (28B) is smaller than diameter (X1) of first opening portion (28A), and diameter (X4) of fourth opening portion (28D) is smaller than diameter (X2) of second opening portion (28B). Thus, when second opening portion (28B) is formed in relation to first opening portion (28A), a margin is generated in the forming position, allowing positional deviation. In addition, when fourth opening portion (28D) is formed in relation to third opening portion (28C), a margin is also generated in the forming position, allowing positional deviation. Namely, even if the positions of second opening portion (28B) and fourth opening portion (28D) are shifted slightly, that would not prevent a penetrating hole from being formed. In addition, the diameter of first opening portion (28A) and the inner diameter of second opening portion (28B) become smaller in the minus direction of axis Z. The diameter of third opening portion (28C) and the diameter of fourth opening portion (28D) become smaller in the plus direction of axis Z.

When the ratio at which the diameter of first opening portion (28A) becomes narrower in a direction from first surface (F) of core substrate 20 toward second surface (S) is set as (ΔW1), and the ratio at which the diameter of second opening portion (28B) becomes narrower in a direction from first surface (F) of core substrate 20 toward second surface (S) is set as (ΔW2), (ΔW1)>(ΔW2) is satisfied. In addition, when the ratio at which the diameter of third opening portion (28C) becomes narrower in a direction from second surface (S) of core substrate 20 toward first surface (F) is set as (ΔW3), and the ratio at which the diameter of fourth opening portion (28D) becomes narrower in a direction from second surface (S) of core substrate 20 toward first surface (F) is set as (ΔW4), (ΔW3)>(ΔW4) is satisfied. As described, when opening portions (28B, 28D) having relatively small ratios at which their diameters become narrower are connected to each other from both sides, positional deviation of the opening portions seldom occurs.

Figure 11:
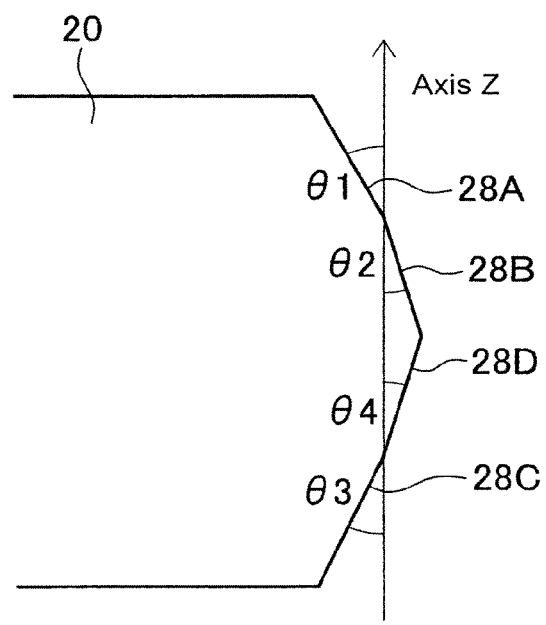
FIG. 11 is a view to illustrate a penetrating hole relating to the first example.

As shown in FIG. 11, the degree at which first opening portion (28A) inclines against axis Z is set as (θ1), the degree at which second opening portion (28B) inclines against axis Z is set as (θ2), the degree at which third opening portion (28C) inclines against axis Z is set as (θ3), and the degree at which fourth opening portion (28D) inclines against axis Z is set as (θ4), (θ1)>(θ2) and (θ3)>(θ4) are satisfied.

In the following, a method for forming penetrating hole 28 is described in detail.

First opening portion (28A) is formed at a predetermined location on the first-surface (F) side of core substrate 20 by irradiating one shot of a CO2 laser. Next, using a CO2 gas laser from the first-surface (F) (upper surface) side of core substrate 20, multiple shots of laser irradiation are performed to form second opening portion (28B) from the bottom of first opening portion (28A) toward second surface (S). The diameter of second opening portion (28B) is smaller than the diameter of first opening portion (28A).

Next, third opening portion (28C) is formed at a predetermined location on the second-surface (S) side of core substrate 20 by irradiating one shot of a CO2 gas laser. The laser conditions are the same when forming first opening portion (28A) and third opening portion (28C). Next, using a CO2 laser from the second-surface (S) (lower surface) side of core substrate 20, multiple shots of laser irradiation are performed to form fourth opening portion (28D) from the bottom of third opening portion (28C) toward first surface (F). The diameter of fourth opening portion (28D) is smaller than the diameter of third opening portion (28C).

The diameter of a laser for forming second opening portion (28B) (the diameter of an aperture) is smaller than the diameter of a laser for forming first opening portion (28A) (the diameter of an aperture). The pulse width of the laser for forming second opening portion (28B) is greater than the pulse width of the laser for forming first opening portion (28A).

Also, the diameter of a laser for forming fourth opening portion (28D) (the diameter of an aperture) is smaller than the diameter of a laser for forming third opening portion (28C). The pulse width of the laser for forming fourth opening portion (28D) is greater than the pulse width of the laser for forming third opening portion (28C).

When the pulse width of the laser for forming second opening portion (28B) and fourth opening portion (28D) is set as "A" and the pulse width of the laser for forming first opening portion (28A) and third opening portion (28C) is set as "B," it is preferred that 1.5≤A/B≤3 be satisfied.

Accordingly, a penetrating hole with a small diameter is formed efficiently (with a minimum number of shots). If "A/B" is smaller than 1.5, formation of an opening does not progress, the number of shots is required to increase, and manufacturing efficiency is likely to decrease. On the other hand, if "A/B" exceeds 3, thermal diffusion progresses excessively in a horizontal direction, and an opening diameter becomes excessively great in proportion to the opening depth.

When the thickness of core substrate 20 is 0.4 mm or greater, the number of laser shots is preferred to be two or greater when second opening portion (28B) and fourth opening portion (28D) are formed. In such a case, a penetrating hole with a small diameter is formed efficiently.

Figure 12:
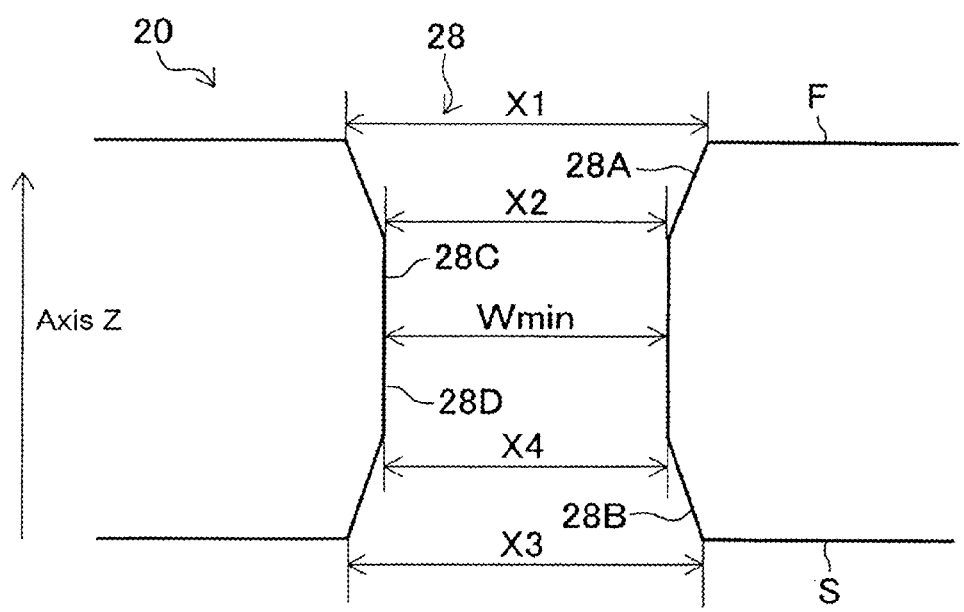
FIG. 12 is a view to illustrate a penetrating hole relating to the first example.

As shown in FIG. 12, the inner walls of second opening portion (28B) and fourth opening portion (28D) may be aligned along a straight line, namely, (X3), (X4) and (Wmin)

may be substantially the same in an embodiment of the present invention. At that time, the above (θ2) and (θ4) are substantially zero (0).

(3) Then, core substrate 20 having penetrating hole 28 is immersed in a solution containing permanganic acid at a predetermined concentration to perform a desmearing treatment. At that time, the degree of weight reduction of core substrate 20 is preferred to be 1.0 wt. % or less, more preferably 0.5 wt. % or less. The core substrate is made by impregnating resin with reinforcing material such as glass cloth. When resin is dissolved in a desmearing treatment, glass cloth protrudes inside a penetrating hole. However, when the degree of weight reduction of the core material is in the above range, protrusion of glass cloth is suppressed, and a void seldom remains when plating is filled in the penetrating hole.

A palladium catalyst is attached to the surfaces of core substrate 20. After that, core substrate 20 is immersed in an electroless plating solution to form electroless plated film 31 on first surface (F) and second surface (S) of core substrate 20 and on the inner wall of penetrating hole 28 (FIG. 2(A)). As the material for forming electroless plated film 31, copper, nickel and the like are listed. Using the electroless plated film as a seed layer, electrolytic plated film 32 is formed on electroless plated film 31. Penetrating hole 28 is filled with electrolytic plated film (FIG. 2(B)).

At that time, in penetrating hole 28, the diameters of first opening portion (28A) positioned on the first-surface (F) side and third opening portion (28C) positioned on the second-surface (S) side are formed relatively large. Namely, the diameters of opening portions (28A, 28C) at end portions are formed relatively large in a penetrating hole formed in core substrate 20. Thus, when electrolytic plating is filled in a penetrating hole, circulation of an electrolytic plating solution is facilitated in the penetrating hole. Namely, electrolytic plating tends to circulate in penetrating hole 28. As a result, electrolytic plating is filled in penetrating hole 28 in a preferred way without causing a void. Thus, a through-hole conductor with excellent electrical characteristics is formed.

(4) Etching resist 40 with a predetermined pattern is formed on electrolytic plated film 32 on the substrate surfaces (FIG. 2(C)).

(5) From portions where etching resist 40 is not formed, electroless plated film 31, electrolytic plated film 32 and copper foil are removed (FIG. 2(D)).

(6) Etching resist 40 is removed. Accordingly, first conductor (34A) is formed on first surface (F) of core substrate 20 and second conductor (34B) is formed on second surface (S) of core substrate 20. First conductor (34A) and second conductor (34B) are connected by through-hole conductor 36 in penetrating hole 28 (see FIG. 3(A)).

(7) Resin film for interlayer resin insulation layers (brand name: ABF-45SH, made by Ajinomoto) is laminated on both surfaces (F, S) of core substrate 20 to form interlayer resin insulation layers (50A, 50B) (see FIG. 3(B)).

(8) Next, via hole openings (51A, 51B) are formed respectively in interlayer resin insulation layers (50A, 50B) using a CO2 gas laser (see FIG. 3(C)). The substrate is immersed in an oxidation agent such as permanganate to perform a desmearing treatment (not shown in the drawings).

(9) By attaching catalyst such as palladium to the surfaces of interlayer resin insulation layers (50A, 50B), and by immersing the substrate in an electroless plating solution, electroless plated films (52A, 52B) are formed (FIG. 3(D)).

(10) Plating resist 54 is formed on electroless plated films 52 (FIG. 4(A)).

(11) Electrolytic plated films (56A, 56B) are formed on electroless plated films 52 exposed from plating resist 54 (see FIG. 4(B)).

(12) Plating resist 54 is removed using a solution containing monoethanolamine. Electroless plated film between portions of electrolytic plated film is etched away, and third conductors (58A, 58B) and via conductors (60A, 60B) are formed. Then, Sn plating is performed on surfaces of third conductors (58A, 58B) to form SnCu layers. A silane coupling agent is applied on the SnCu layers (FIG. 4(C)).

(13) Next, above steps (7) through (12) are repeated (FIG. 5(A)). Then, solder-resist layers (70A, 70B) having openings (71A, 71B) are formed on both surfaces of the substrate (FIG. 5(B)). The upper surfaces of third conductors (158A, 158B) exposed through openings (71A, 71B) work as solder pads. Nickel-plated layers (72A, 72B) are formed on solder pads and gold-plated layers (74A, 74B) are further formed on nickel-plated layers 72 (FIG. 5(C)). Instead of nickel-gold layers, nickel-palladium-gold layers may be formed.

(19) Then, by loading solder balls in openings (71a, 71b) and by conducting a reflow, solder bump (76U) is formed on the first-surface (upper surface) side, and solder bump (76D) is formed on the second-surface (lower surface) side to complete multilayer printed wiring board 10 (FIG. 6).

FIRST EXAMPLE

A method for manufacturing a multilayer printed wiring board is described according to the first example of the present invention. First, a core substrate made of glass cloth, epoxy resin and magnesium hydroxide is prepared. The thickness of the core substrate is approximately 0.4 mm. Copper foil is formed respectively on the first surface and the second surface of the core substrate.

Using a CO2 laser from the first-surface side of the core substrate, laser irradiation is performed to form a first opening portion on the first-surface side of the core substrate. Here, the number of shots of laser irradiation is one. The first opening portion is an opening portion that penetrates at least through copper foil.

Next, using a CO2 laser from the first-surface side of the core substrate, laser irradiation is performed to form a second opening portion from the bottom of the first opening portion toward the second surface. Here, the number of shots of laser irradiation is two. The diameter of a laser for forming the second opening portion (the diameter of an aperture) is smaller than the diameter of a laser for forming the first opening portion (the diameter of an aperture). The pulse width of the laser for forming the second opening portion is greater than the pulse width of the laser for forming the first opening portion. Then, bent portion (P1) is formed at the boundary of the first opening portion and the second opening portion.

Using a CO2 laser from the second-surface side of the core substrate, laser irradiation is performed to form a third opening portion on the second-surface side of the core substrate. Here, the number of shots of laser irradiation is one. The third opening portion is an opening portion that penetrates at least through copper foil.

Next, using a CO2 laser from the second-surface side of the core substrate, laser irradiation is performed to form a fourth opening portion from the bottom of the third opening portion toward the first surface. Here, the number of shots of laser irradiation is two. The diameter of a laser for forming the fourth opening portion (the diameter of an aperture) is smaller than the diameter of a laser for forming the third opening portion (the diameter of an aperture). The pulse width of the laser for forming the fourth opening portion is greater than the pulse width of the laser for forming the third opening portion. A bent portion is formed at the boundary of the third opening portion and the fourth opening portion.

The core substrate having a penetrating hole is immersed in a solution containing permanganic acid at a predetermined concentration to perform a desmearing treatment. A palladium catalyst is attached on the surfaces of the core substrate. Then, the core substrate is immersed in an electroless plating solution to form electroless plated film on the first surface and second surface of the core substrate and on the inner wall of the penetrating hole. Using the electroless plated film as a seed layer, electrolytic plated film is formed on the electroless plated film. The penetrating hole is filled with electrolytic plated film. Etching resist with a predetermined pattern is formed on the electrolytic plated film on the substrate surfaces.

From the portions where etching resist is not formed, electroless plated film 31, electrolytic plated film 32 and copper foil are removed.

Etching resist is removed. Accordingly, a first conductor is formed on the first surface of the core substrate, and a second conductor is formed on the second surface of the core substrate. Those first and second conductors are connected by the through-hole conductor in a penetrating hole. Through the above procedure, a through-hole conductor of the first example is completed in a printed wiring board.

SECOND EXAMPLE

The method for manufacturing a printed wiring board according to the second example is a modified example of the first example. A core substrate in the second example has a different thickness from the first example. The thickness of the core substrate is approximately 0.7 mm in the second example. When a penetrating hole is formed in the core substrate, first, using a CO2 laser from the first-surface side of the core substrate, laser irradiation is performed to form a first opening portion on the first-surface side of the core substrate. The number of shots of laser irradiation here is one. The first opening portion is an opening portion that penetrates at least through copper foil.

Next, using a CO2 laser from the first-surface side of the core substrate, laser irradiation is performed to form a second opening portion from the bottom of the first opening portion toward the second surface. Here, the number of shots of laser irradiation is five. The diameter of a laser for forming the second opening portion (the diameter of an aperture) is smaller than the diameter of a laser for forming the first opening portion (the diameter of an aperture). The pulse width of the laser for forming the second opening portion is greater than the pulse width of the laser for forming the first opening portion. A bent portion is formed at the boundary of the first opening portion and the second opening portion.

Using a CO2 laser from the second-surface side of the core substrate, laser irradiation is performed to form a third opening portion on the second-surface side of the core substrate. Here, the number of shots of laser irradiation is one. The third opening portion is an opening portion that penetrates at least through copper foil.

Next, using a CO2 laser from the second-surface side of the core substrate, laser irradiation is performed to form a fourth opening portion from the bottom of the third opening portion toward the first surface. Here, the number of shots of laser irradiation is five. The diameter of a laser for forming the fourth opening portion (the diameter of an aperture) is smaller than the diameter of a laser for forming the third opening portion. The pulse width of the laser for forming the fourth opening portion is greater than the pulse width of the laser for forming the third opening portion. A bent portion is formed at the boundary of the third opening portion and the fourth opening portion. Accordingly, penetrating hole 28 is formed in core substrate 30.

A method for manufacturing a printed wiring board according to an embodiment of the present invention includes the following technological characteristics: preparing a core substrate having a first surface and a second surface opposite the first surface; forming a penetrating hole in the core substrate by forming a first opening portion on the first-surface side of the core substrate, by forming a second opening portion from the bottom of the first opening portion toward the second surface, by forming a third opening portion on the second-surface side of the core substrate, and by forming a fourth opening portion from the bottom of the third opening portion toward the first surface; forming a first conductor on the first surface of the core substrate; forming a second conductor on the second surface of the core substrate; and by filling conductive material in the penetrating hole, forming a through-hole conductor that connects the first conductor and the second conductor. In such a method, the diameter of the second opening portion is smaller than the diameter of the first opening portion, and the diameter of the fourth opening portion is smaller than the diameter of the third opening portion.

First, a first opening portion is formed on a first-surface side of a core substrate, and a second opening portion is further formed at the bottom of the first opening portion. Then, a third opening portion is formed on a second-surface side of the core substrate, and a fourth opening portion is formed at the bottom of the third opening portion. By connecting the fourth opening portion and the second opening portion, a penetrating hole is formed.

During that time, the second opening portion has a smaller diameter than the first opening portion, and the fourth opening portion has a smaller diameter than the third opening portion. Accordingly, when forming the second opening portion in relation to the first opening portion, a margin is generated in the forming position, allowing positional deviation. Moreover, when forming the fourth opening portion in relation to the third opening portion, a margin is also generated in the forming position, allowing positional deviation. Namely, even if the positions for forming the second opening portion and the fourth opening portion are shifted slightly, it is thought that such a deviation does not prevent a penetrating hole from being formed, and a penetrating hole with a small diameter is easily formed.

In addition, the diameters are set relatively large in the first opening portion positioned on the first-surface side of the core substrate and in the third opening portion positioned on the second-surface side. Namely, in the penetrating hole formed in the core substrate, the diameters of the opening portions on both sides are set relatively large. Therefore, when a through-hole conductor is formed by filling conductive material such as electrolytic plating inside the penetrating hole, circulation of the conductive material is facilitated in the penetrating hole. Namely, conductive material tends to circulate in the penetrating hole. As a result, without causing a void in the penetrating hole, conductive material is filled in a preferred way, and a through-hole conductor with excellent electrical characteristics is formed.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   preparing a core substrate;
   forming a penetrating hole in the core substrate;
   forming a first conductor on a first surface of the core substrate;
   forming a second conductor on a second surface of the core substrate on an opposite side of the first surface of the core substrate; and
   filling a conductive material in the penetrating hole such that a through-hole conductor is formed in the penetrating hole and the first conductor and the second conductor are connected via the through-hole conductor,
   wherein the forming of the penetrating hole comprises forming a first opening portion in the first surface of the core substrate, forming a second opening portion from a bottom portion of the first opening portion toward the second surface such that the second opening portion forms a first bent portion connected to the first opening portion and has a diameter which is smaller than a diameter of the first opening portion, forming a third opening portion in the second surface of the core substrate, and forming a fourth opening portion from a bottom portion of the third opening portion toward the first surface such that the fourth opening portion forms a second bent portion connected to the third opening portion and a third bend portion connected to the second opening portion and has a diameter which is smaller than a diameter of the third opening portion, the first opening portion inclines at an angle $\theta 1$ and the second opening portion inclines at an angle $\theta 2$ such that $\theta 1 > \theta 2$ is satisfied with respect to an axis normal to the first and second surfaces, and the third opening portion inclines at an angle $\theta 3$ and the fourth opening portion inclines at an angle $\theta 4$ such that $\theta 3 > \theta 4$ is satisfied with respect to the axis normal to the first and second surfaces.

2. The method for manufacturing a printed wiring board according to claim 1, wherein the forming of the first opening portion comprises tapering the first opening portion to become narrower from the first surface of the core substrate toward the second surface, the forming of the second opening portion comprises tapering the second opening portion to become narrower from the first surface of the core substrate toward the second surface, the forming of the third opening portion comprises tapering third opening portion to become narrower from the second surface of the core substrate toward the first surface, and the forming of the fourth opening portion comprises tapering the fourth opening portion to become narrower from the second surface of the core substrate toward the first surface.

3. The method for manufacturing a printed wiring board according to claim 2, wherein the forming of the first opening portion and the forming of the second opening portion satisfy $\Delta W1 > \Delta W2$, where $\Delta W1$ represents a ratio at which a diameter of the first opening portion becomes narrower in a direction from the first surface of the core substrate toward the second surface, and $\Delta W2$ represents a ratio at which a diameter of the second opening portion becomes narrower in a direction from the first surface of the core substrate toward the second surface, and the forming of the third opening portion and the forming of the fourth opening portion satisfy $\Delta W3 > \Delta W4$, where $\Delta W3$ represents a ratio at which a diameter of the third opening portion becomes narrower in a direction from the second surface of the core substrate toward the first surface, and $\Delta W4$ represents a ratio at which a diameter of the fourth opening portion becomes narrower in a direction from the second surface of the core substrate toward the first surface.

4. The method for manufacturing a printed wiring board according to claim 1, wherein the forming of the penetrating hole comprises irradiating laser such that the penetrating hole is formed.

5. The method for manufacturing a printed wiring board according to claim 4, wherein the irradiating of the laser comprises setting a laser diameter for forming the second opening portion to be smaller than a laser diameter for forming the first opening portion, and setting a laser diameter for forming the fourth opening portion to be smaller than a laser diameter for forming the third opening portion.

6. The method for manufacturing a printed wiring board according to claim 4, wherein the laser for forming the second opening portion has a pulse width which is set to be longer than a pulse width of the laser for forming the first opening portion, and the laser for forming the fourth opening portion has a pulse width which is set to be longer than a pulse width of the laser for forming the third opening portion.

7. The method for manufacturing a printed wiring board according to claim 4, wherein the irradiating of the laser satisfies $1.5 \leq B/A \leq 3$, where A represents the pulse width of the laser for forming the first opening portion and the third opening portion, and B represents the pulse width of the laser for forming the second opening portion and the fourth opening portion.

8. The method for manufacturing a printed wiring board according to claim 4, wherein the irradiating of the laser comprises taking at least two shots of the laser for forming the second opening portion and the fourth opening portion.

9. The method for manufacturing a printed wiring board according to claim 8, wherein the irradiating of the laser comprises setting laser conditions for each shot of the laser for forming the second opening portion and the fourth opening portion to be substantially a same.

10. The method for manufacturing a printed wiring board according to claim 1, wherein the forming of the penetrating hole comprises offsetting a straight line passing through the gravity center of the second opening portion and perpendicular to the first surface of the core substrate from a straight line passing through the gravity center of the fourth opening portion and perpendicular to the second surface of the core substrate.

11. The method for manufacturing a printed wiring board according to claim 1, wherein the core substrate has a thickness which is 0.4mm or greater.

12. The method for manufacturing a printed wiring board according to claim 1, wherein the forming of the penetrating hole satisfies $0.6 \leq Wmin/Wmax \leq 0.8$, where Wmax represents the maximum diameter of the penetrating hole, and Wmin represents the minimum diameter of the penetrating hole.

13. The method for manufacturing a printed wiring board according to claim 1, wherein at least one of the first opening portion and the second opening portion is formed such that at least one of the first opening portion and the second opening portion has the maximum diameter of the penetrating hole.

14. The method for manufacturing a printed wiring board according to claim 1, wherein the fourth opening portion is formed such that the third bend portion forms the minimum diameter of the penetrating hole.

15. The method for manufacturing a printed wiring board according to claim 1, wherein at least one of the first opening portion and the second opening portion is formed such that at least one of the first opening portion and the second opening portion has the maximum diameter of the penetrating hole, and the fourth opening portion is formed such that the third bend portion forms the minimum diameter of the penetrating hole.

16. The method for manufacturing a printed wiring board according to claim 1, wherein at least one of the first opening portion and the second opening portion is formed such that at least one of the first opening portion and the second opening portion has the maximum diameter of the penetrating hole, the fourth opening portion is formed such that the third bend portion forms the minimum diameter of the penetrating hole, and the forming of the penetrating hole satisfies $0.6 \leq W_{min}/W_{max} \leq 0.8$, where Wmax represents the maximum diameter of the penetrating hole, and Wmin represents the minimum diameter of the penetrating hole.

17. The method for manufacturing a printed wiring board according to claim 1, wherein the core substrate is an insulative substrate comprising resin.

18. The method for manufacturing a printed wiring board according to claim 1, wherein the core substrate is an insulative substrate comprising reinforcing material and resin.

19. The method for manufacturing a printed wiring board according to claim 17, wherein the fourth opening portion is formed such that the third bend portion forms the minimum diameter of the penetrating hole.

20. The method for manufacturing a printed wiring board according to claim 17, wherein at least one of the first opening portion and the second opening portion is formed such that at least one of the first opening portion and the second opening portion has the maximum diameter of the penetrating hole, and the fourth opening portion is formed such that the third bend portion forms the minimum diameter of the penetrating hole.

* * * * *